United States Patent [19]

Ansell et al.

[11] Patent Number: 5,353,202
[45] Date of Patent: Oct. 4, 1994

[54] PERSONAL COMPUTER WITH SHIELDING OF INPUT/OUTPUT SIGNALS

[75] Inventors: Daniel F. Ansell, Coral Springs; Jeffrey W. Benck, Delray Beach; Thomas A. Bocchino; James W. Deiso, both of Boynton Beach; Jose E. Richards, Deerfield Beach; Mark L. Shipley, Lake Worth; Robert D. Wysong, Boca Raton, all of Fla.

[73] Assignee: International Business Machines Corp., Armonk, N.Y.

[21] Appl. No.: 185,723

[22] Filed: Jan. 24, 1994

Related U.S. Application Data

[63] Continuation of Ser. No. 556,924, Jul. 20, 1990, abandoned.

[51] Int. Cl.$^5$ ................................ H05K 9/00
[52] U.S. Cl. ........................ 361/818; 174/35 R; 174/35 C; 174/35 GC; 361/816; 361/794; 361/795; 361/785; 361/752; 361/753
[58] Field of Search ............ 174/35 R, 35 C, 35 TS, 174/51; 333/12; 330/68; 334/85; 361/752, 753, 785, 795, 816, 818, 794; 439/108, 109, 607, 608, 609

[56] References Cited

U.S. PATENT DOCUMENTS

| | | | |
|---|---|---|---|
| 3,654,379 | 4/1972 | Rogers | 174/35 GC |
| 3,885,084 | 5/1975 | Kaiserwerth et al. | 174/35 GC |
| 3,904,810 | 9/1975 | Kraus | 174/35 GC |
| 4,337,989 | 7/1982 | Asick et al. | 439/607 |
| 4,404,617 | 9/1983 | Ohyama et al. | 361/424 |
| 4,521,062 | 6/1985 | Kurbikoff et al. | 439/607 |
| 4,567,336 | 6/1986 | Lemche | 174/35 GC |
| 4,620,265 | 10/1986 | Lerude et al. | 361/424 |
| 4,661,888 | 4/1987 | Jewell et al. | 361/424 |
| 4,762,966 | 9/1988 | Kosanda | 174/35 GC |
| 4,780,570 | 10/1988 | Chuck | 361/424 |
| 4,823,235 | 4/1989 | Suzuki et al. | 361/424 |
| 4,868,716 | 9/1989 | Taylor et al. | 361/424 |
| 4,872,090 | 10/1989 | Taylor et al. | 361/424 |
| 4,889,959 | 12/1989 | Taylor et al. | 174/35 GC |
| 4,899,254 | 2/1990 | Ferchau et al. | 361/413 |
| 4,901,205 | 2/1990 | Landis et al. | 174/35 GC |
| 4,915,652 | 4/1990 | Madara | 439/607 |
| 4,943,244 | 7/1990 | Teck et al. | 439/607 |
| 4,954,929 | 9/1990 | Baran | 361/424 |
| 5,130,896 | 7/1992 | Babb et al. | 361/424 |
| 5,192,228 | 3/1993 | Collins et al. | 439/607 |

FOREIGN PATENT DOCUMENTS

| | | | |
|---|---|---|---|
| 0467521 | 1/1992 | European Pat. Off. | 174/35 R |
| 1-52388 | 2/1989 | Japan | 439/607 |
| 2160719 | 12/1985 | United Kingdom | 439/607 |

OTHER PUBLICATIONS

IBM Disclosure Bulletin "Ground Plane Interposer" by Arvamitakis et al. vol. 21 No. 3 Aug. 1978.
IBM Disclosure Bulletin "Personal Computer Structure Designed For Robotized Manufacturability" vol. 30 No. 3 Aug. 1987.
IBM Disclosure Bulletin "Connector Shield/Bracket To Provide Electromagnetic Compatability" vol. 30 No. 6 Nov. 1987.

Primary Examiner—Leo P. Picard
Assistant Examiner—Donald A. Sparks
Attorney, Agent, or Firm—Daniel E. McConnell

[57] ABSTRACT

This invention relates to personal computers, and more particularly to the provision of a shielding structure for attenuating the possible effects of electromagnetic interference on input/output circuits of the computer while structurally reinforcing a side edge portion of a multilayer planar board. The shielding structure has two cooperating constituent parts, one being particularly formed ground plane areas in exterior layers of the planar board and the other being a particularly formed thin sheet metal member which extends about and substantially encloses connectors by which input/output signals are passed to circuits within the planar board.

9 Claims, 6 Drawing Sheets

PERSONAL COMPUTER WITH SHIELDING OF INPUT/OUTPUT SIGNALS

RELATED APPLICATION

This application is a continuation of identically titled, co-pending application Ser. No. 07/556,924 filed Jul. 20, 1990, now abandoned, in the names of D. F. Ansell, J. W. Benck, T. A. Bocchino, J. W. Desio, J. E. Richards, M. L. Shipley, and R. D. Wysong and now abandoned.

FIELD AND BACKGROUND OF INVENTION

This invention relates to personal computers, and more particularly to the provision of shielding for attenuating the possible effects of electromagnetic interference on input/output circuits of the computer.

Personal computer systems in general and IBM personal computers in particular have attained widespread use for providing computing capability to many segments of today's modern society. Personal computer systems can usually be defined as a desk top, floor standing, or portable microcomputer that consists of a system unit having a single system processor and associated volatile and non-volatile memory, a display monitor, a keyboard, one or more diskette drives, a fixed disk storage, and an optional printer. One of the distinguishing characteristics of these systems is the use of a motherboard or system planar to electrically connect these components together. These systems are designed primarily to give independent computing capability to a single user and are inexpensively priced for purchase by individuals or small businesses. Examples of such personal computer systems are IBM's PERSONAL COMPUTER XT and AT and IBM's PERSONAL SYSTEM/2 Models 25, 30, 50, 60, 70 and 80.

These systems can be classified into two general families. The first family, usually referred to as Family I Models, use a bus architecture exemplified by the IBM PERSONAL COMPUTER AT and other "IBM compatible" machines. The second family, referred to as Family II Models, use IBM's MICRO CHANNEL bus architecture exemplified by IBM's PERSONAL SYSTEM/2 Models 50 through 80. Many Family I models used the popular INTEL 8088 or 8086 microprocessor as the system processor. These processors have the ability to address one megabyte of memory. Certain Family I and most Family II models typically use the high speed INTEL 80286, 80386, and 80486 microprocessors which can operate in a real mode to emulate the slower speed INTEL 8086 microprocessor or a protected mode which extends the addressing range from 1 megabyte to 4 Gigabytes for some models. In essence, the real mode feature of the 80286, 80386, and 80486 processors provide hardware compatibility with software written for the 8086 and 8088 microprocessors.

It is well known that the components of a personal computer housed within an enclosure and supported from the chassis or connected with the planar board are capable of emitting electromagnetic radiation at various frequencies and that standards have been established for limiting the emission of such energy to various limits depending on the environment of use of the computer. Further, it is known that higher speed processors and circuits associated with such processors, such as those specifically mentioned above, typically emit radiation of differing frequencies and amounts than the earlier designed, slower processors. Heretofore, shielding has been accomplished in various ways, including providing metal enclosures and/or coating or lining the enclosures and covers provided. In achieving shielding in these ways, and attenuating radiation, it has been noted that openings provided in such enclosures and covers can present particularly difficult problems in shielding. Further, it has been noted that the possible effects of electromagnetic interference, such as that briefly described, can be interruption of or interference with input/output signals necessarily exchanged with the operating components of the microcomputer.

As the development of personal computer technology has advanced, personal computers have been enabled to incorporate increasingly higher data handling speeds in processors, data storage devices, and memory. Such higher speeds bring with them greater emission of electromagnetic radiation, increasing the demands placed on enclosures for the attenuation of such emissions and the risks of possible interference with input/output signals. Other terms used to refer to such requirements have been electromagnetic compatibility and the suppression of electromagnetic interference. In efforts to bring emissions within the required standards while attaining the sought for high speeds, designs have moved toward a completely grounded enclosure with minimal gaps and openings.

BRIEF DESCRIPTION OF INVENTION

With the foregoing particularly in mind, it is an object of this invention to effectively prevent adverse effects on input/output signals by electromagnetic interference in the environment described. In realizing this object of the present invention, shielding is provided for the area through which such input/output signals pass to and from conductive pathways provided in interior layers of a multilayer planar board.

Yet a further object of the invention is to assure that the users and environment of use of a personal computer are protected against undue electromagnetic emissions. In realizing this object of the present invention, shield means are provided for the portions of the planar board and for the connectors through which input/output signals pass.

BRIEF DESCRIPTION OF DRAWINGS

Some of the objects of the invention having been stated, other objects will appear as the description proceeds, when taken in connection with the accompanying drawings, in which.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Figure 1:
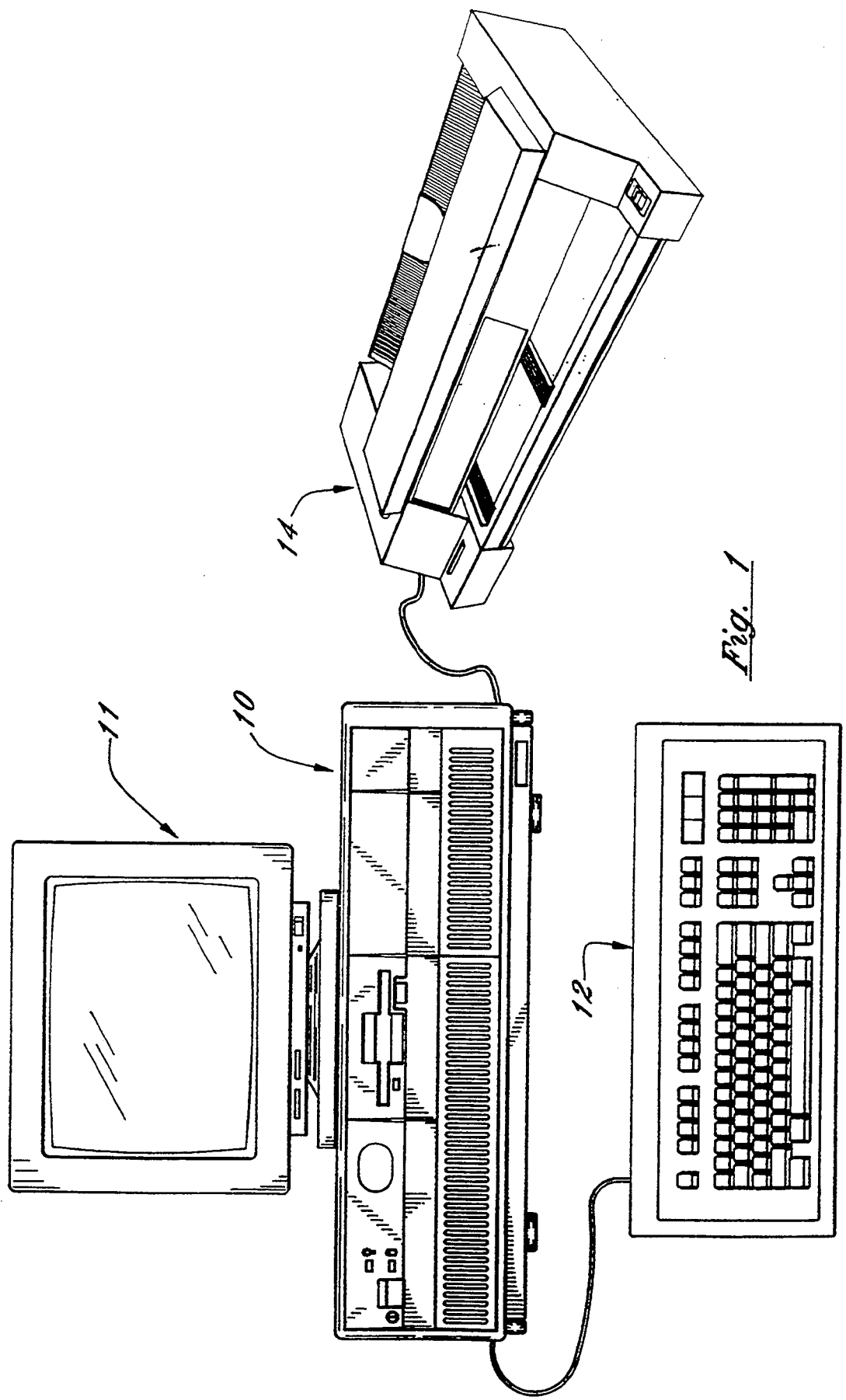
FIG. 1 is a perspective view of a personal computer embodying this invention.

Referring now more particularly to the accompanying drawings, a microcomputer embodying the present invention is there shown and generally indicated at 10 (FIG. 1). As mentioned hereinabove, the computer 10 may have an associated monitor 11, keyboard 12 and printer or plotter 14. The computer 10 has a cover 15 formed by a decorative outer member 16 (FIG. 2) and an inner shield member 18 which cooperate with a chassis 19 in defining an enclosed, shielded volume for receiving electrically powered data processing and storage components for processing and storing digital data. At least certain of these components are mounted on a multilayer planar 20 or motherboard which is mounted on the chassis 19 and provides a means for electrically interconnecting the components of the computer 10 including those identified above and such other associated elements as floppy disk drives, various forms of direct access storage devices, accessory cards or boards, and the like. As pointed out more fully hereinafter, provisions are made in the planar 20 for the passage of input/output signals to and from the operating components of the microcomputer.

Figure 2:
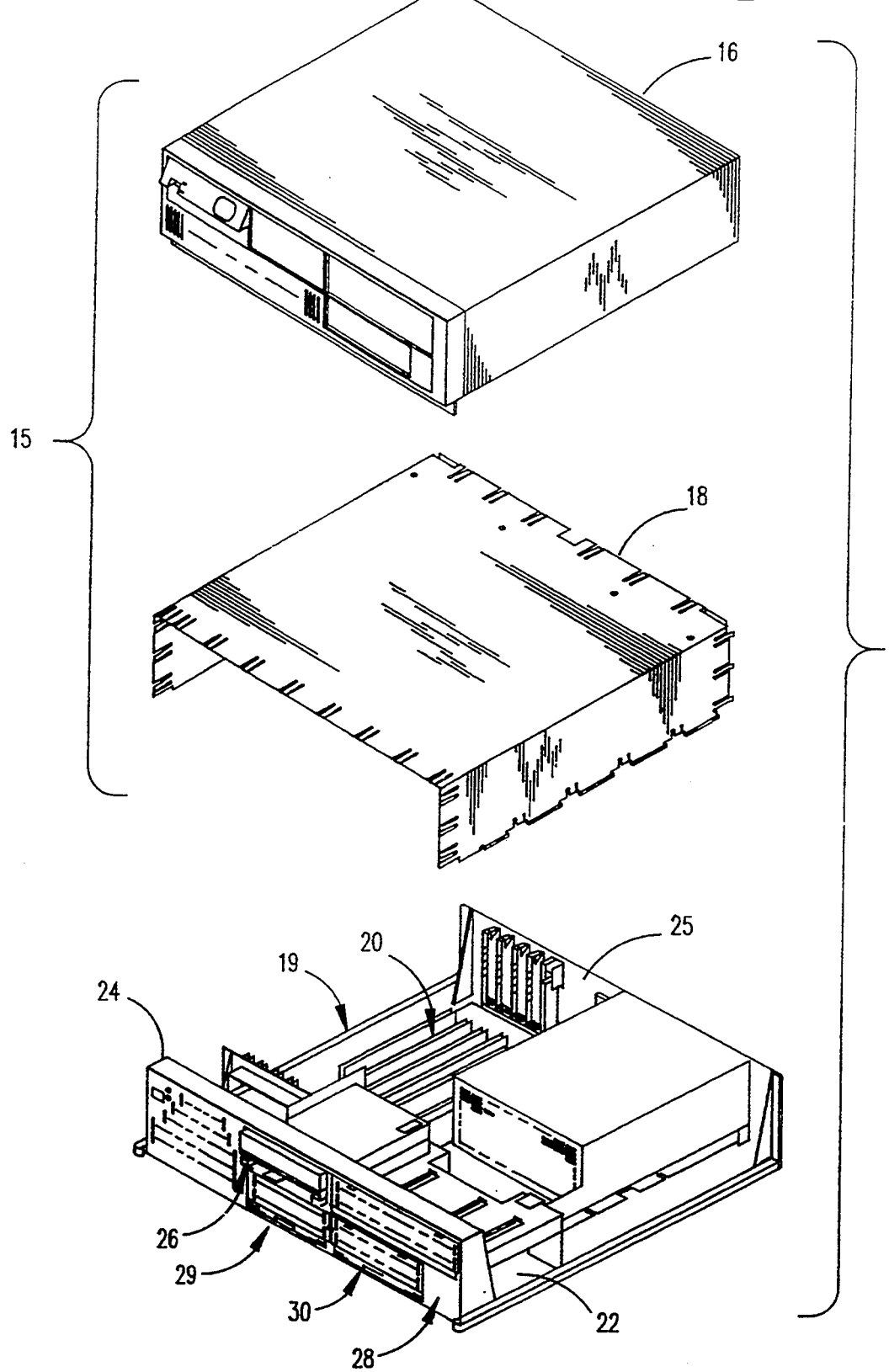
FIG. 2 is an exploded perspective view of certain elements of the personal computer of FIG. 1 including a chassis, a cover, an electromechanical direct access storage device and a multiple layer planar board and illustrating certain relationships among those elements.

The chassis 19 has a base indicated at 22, a front panel indicated at 24, and a rear panel indicated at 25 (FIG. 2). The front panel 24 defines at least one open bay (and in the form illustrated, four bays) for receiving a data storage device such as a disk drive for magnetic or optical disks, a tape backup drive, or the like. In the illustrated form, a pair of upper bays 26, 28 and a pair of lower bays 29, 30 are provided. One of the upper bays 26 is adapted to receive peripheral drives of a first size (such as those known as 3.5 inch drives) while the other 28 is adapted to receive drives of a selected one of two sizes (such as 3.5 and 5.25 inch) and the lower bays are adapted to receive devices of only one size (3.5 inch).

Figure 3:
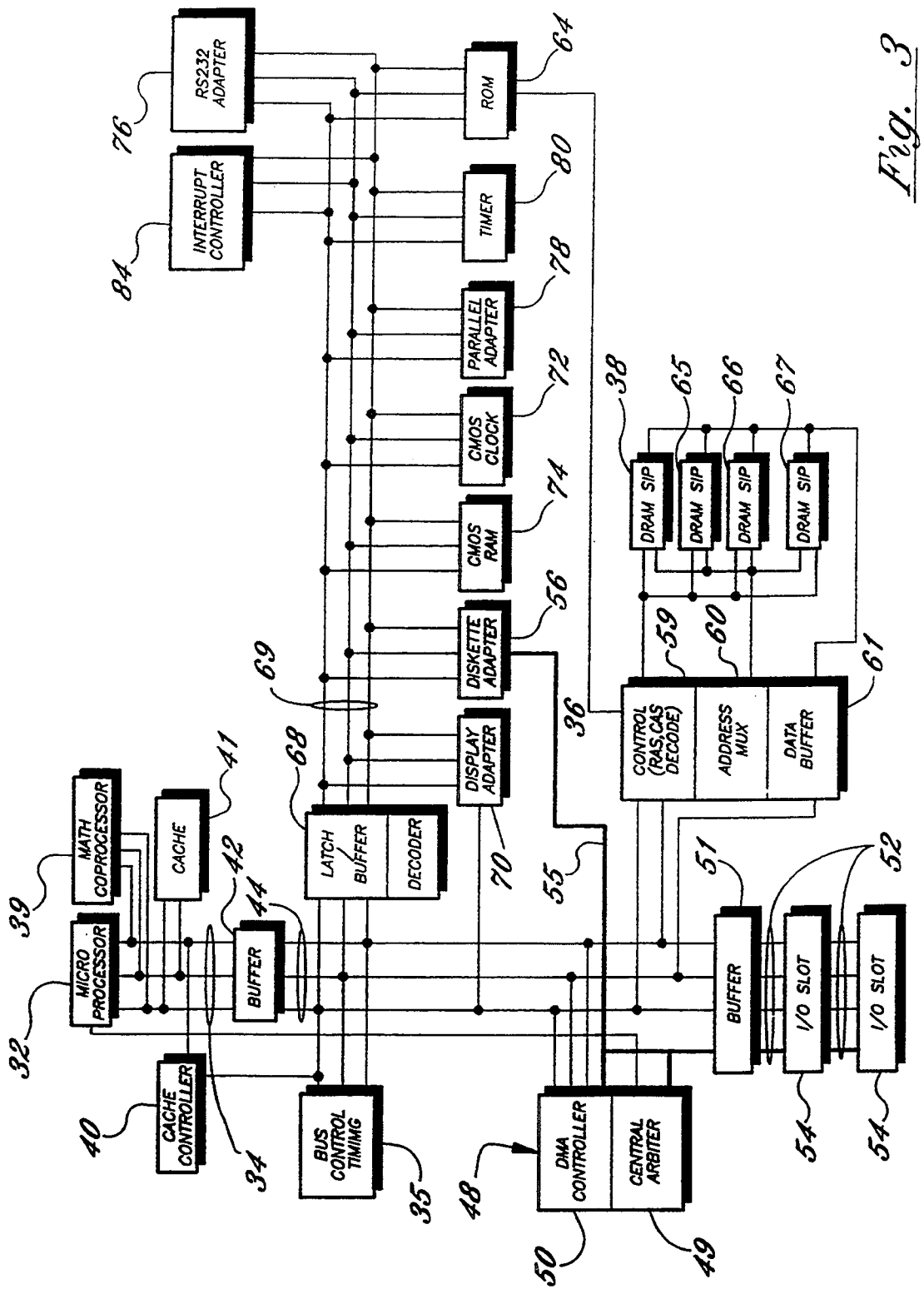
FIG. 3 is a schematic view of certain components of the personal computer of FIGS. 1 and 2.

Prior to relating the above structure to the present invention, a summary of the operation in general of the personal computer system 10 may merit review. Referring to FIG. 3, there is shown a block diagram of a personal computer system illustrating the various components of the computer system such as the system 10 in accordance with the present invention, including components mounted on the planar 20 and the connection of the planar to the I/O slots and other hardware of the personal computer system. Connected to the planar is the system processor 32 comprised of a microprocessor which is connected by a high speed CPU local bus 34 through a bus control timing unit 35 to a memory control unit 36 which is further connected to a volatile random access memory (RAM) 38. While any appropriate microprocessor can be used, one suitable microprocessor is the 80386 which is sold by INTEL.

While the present invention is described hereinafter with particular reference to the system block diagram of FIG. 3, it is to be understood at the outset of the description which follows that it is contemplated that the apparatus and methods in accordance with the present invention may be used with other hardware configurations of the planar board. For example, the system processor could be an Intel 80286 or 80486 microprocessor.

Returning now to FIG. 3, the CPU local bus 34 (comprising data, address and control components) provides for the connection of the microprocessor 32, a math coprocessor 39, a cache controller 40, and a cache memory 41. Also coupled on the CPU local bus 34 is a buffer 42. The buffer 42 is itself connected to a slower speed (compared to the CPU local bus) system bus 44, also comprising address, data and control components. The system bus 44 extends between the buffer 42 and a further buffer 68. The system bus 44 is further connected to a bus control and timing unit 35 and a DMA unit 48. The DMA unit 48 is comprised of a central arbitration unit 49 and DMA controller 50. The buffer 51 provides an interface between the system bus 44 and an optional feature bus such as the MICRO CHANNEL bus 52. Connected to the bus 52 are a plurality of I/O slots 54 for receiving MICRO CHANNEL adapter cards which may be further connected to an I/O device or memory.

An arbitration control bus 55 couples the DMA controller 50 and central arbitration unit 49 to the I/O slots 54 and a diskette adapter 56. Also connected to the system bus 44 is a memory control unit 36 which is comprised of a memory controller 59, an address multiplexor 60, and a data buffer 61. The memory control unit 36 is further connected to a random access memory as represented by the RAM module 38. The memory controller 36 includes the logic for mapping addresses to and from the microprocessor 32 to particular areas of RAM 38. This logic is used to reclaim RAM previously occupied by BIOS. Further generated by memory controller 36 is a ROM select signal (ROMSEL), that is used to enable or disable ROM 64.

While the microcomputer system 10 is shown with a basic 1 megabyte RAM module, it is understood that additional memory can be interconnected as represented in FIG. 3 by the optional memory modules 65 through 67. For purposes of illustration only, the present invention is described with reference to the basic one megabyte memory module 38.

A latch buffer 68 is coupled between the system bus 44 and a planar I/O bus 69. The planar I/O bus 69 includes address, data, and control components respectively. Coupled along the planar I/O bus 69 are a variety of I/O adapters and other components such as the display adapter 70 (which is used to drive the monitor 11), a CMOS clock 72, nonvolatile CMOS RAM 74 herein after referred to as NVRAM, a RS232 adapter 76, a parallel adapter 78, a plurality of timers 80, a diskette adapter 56, an interrupt controller 84, and a read only memory 64. The read only memory 64 includes the BIOS that is used to interface between the I/O devices and the operating system of the microprocessor 32. BIOS stored in ROM 64 can be copied into RAM 38 to decrease the execution time of BIOS. ROM 64 is further responsive (via ROMSEL signal) to memory controller 36. If ROM 64 is enabled by memory controller 36, BIOS is executed out of ROM. If ROM 64 is disabled by memory controller 36, ROM is not responsive to address enquiries from the microprocessor 32 (i.e. BIOS is executed out of RAM).

The planar I/O bus 69, as described hereinafter, includes portions defined by conductive pathways formed in interior layers of the multilayer planar 20, and particularly includes a number of such pathways in a portion extending adjacent an edge of the planar 20 which is positioned to extend adjacent one of the front and rear panels of the chassis. Such design of the planar makes possible the location of a number of I/O connectors along such a side edge for exchange of signals with such devices as the monitor, keyboard and printer.

The clock 72 is used for time of day calculations and the NVRAM is used to store system configuration data. That is, the NVRAM will contain values which describe the present configuration of the system. For example, NVRAM contains information describing the capacity of a fixed disk or diskette, the type of display, the amount of memory, time, date, etc. Of particular importance NVRAM will contain data (can be one bit) which is used by memory controller 36 to determine whether BIOS is run out of ROM or RAM and whether to reclaim RAM intended to be used by BIOS RAM. Furthermore, these data are stored in NVRAM whenever a special configuration program, such as SET Configuration, is executed. The purpose of the SET Configuration program is to store values characterizing the configuration of the system to NVRAM.

As mentioned hereinabove, the computer has a cover indicated generally at 15 which cooperates with the chassis 19 in forming an enclosed, shielded volume for containing the above identified components of the microcomputer. The cover preferably is formed with an outer decorative cover member 16 which is a unitary molded component made of a moldable synthetic material and a metallic thin sheet liner 18 formed to conform to the configuration of the decorative cover member. However, the cover can be made in other known ways and the utility of this invention is not limited to enclosures of the type described.

In order to attenuate the effects of electromagnetic radiation which might otherwise interfere with the orderly operation of the computer components described above and to structurally reinforce a side edge of the planar 20, this invention includes shielding structure for shielding against adverse effects otherwise possibly arising from passage of input/output signals to and from interior conductive pathways in the multilayer planar board and for structurally reinforcing the side edge portion through which such signals pass. The shielding structure is operatively connected to a portion of the chassis maintained at a system ground and substantially encloses a region through which input/output signals pass between conductive pathways of the planar board and the chassis panel adjacent the connector. In accordance with this invention, the shielding structure has two constituent parts, one formed in exterior layers of the planar board and another formed as a thin metal strip.

Figure 4:
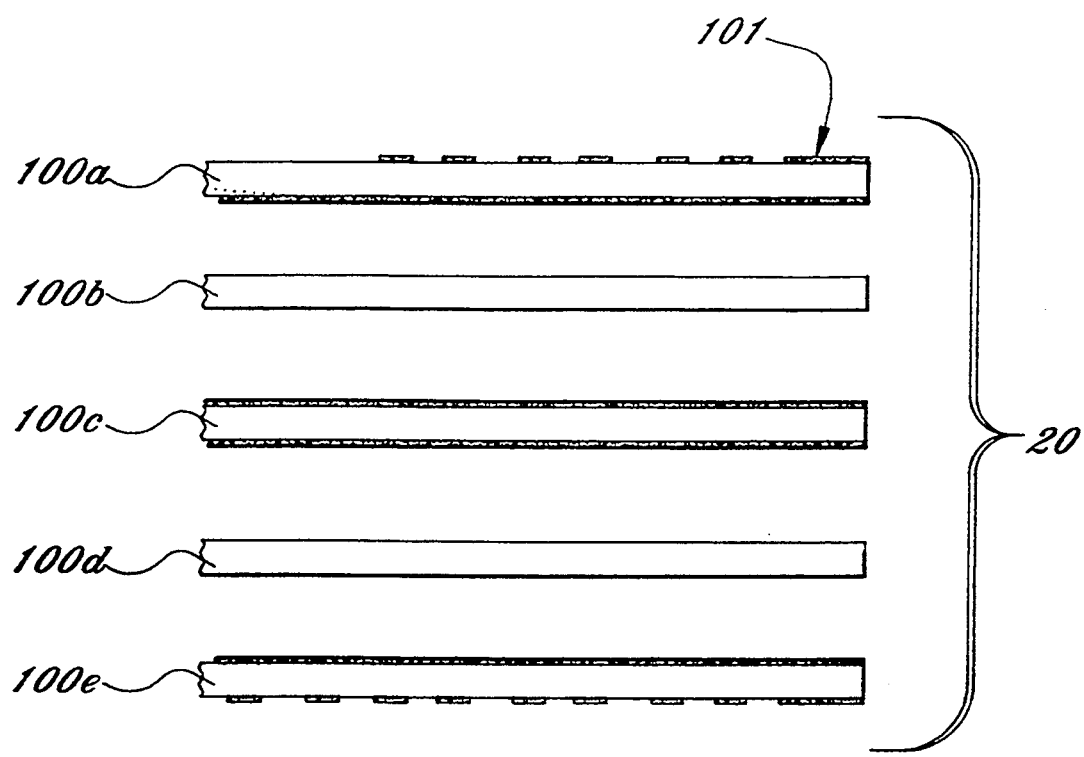
FIG. 4 is an exploded elevation view of the multiple layer planar board included in the computer of FIG. 2.
Figure 5:
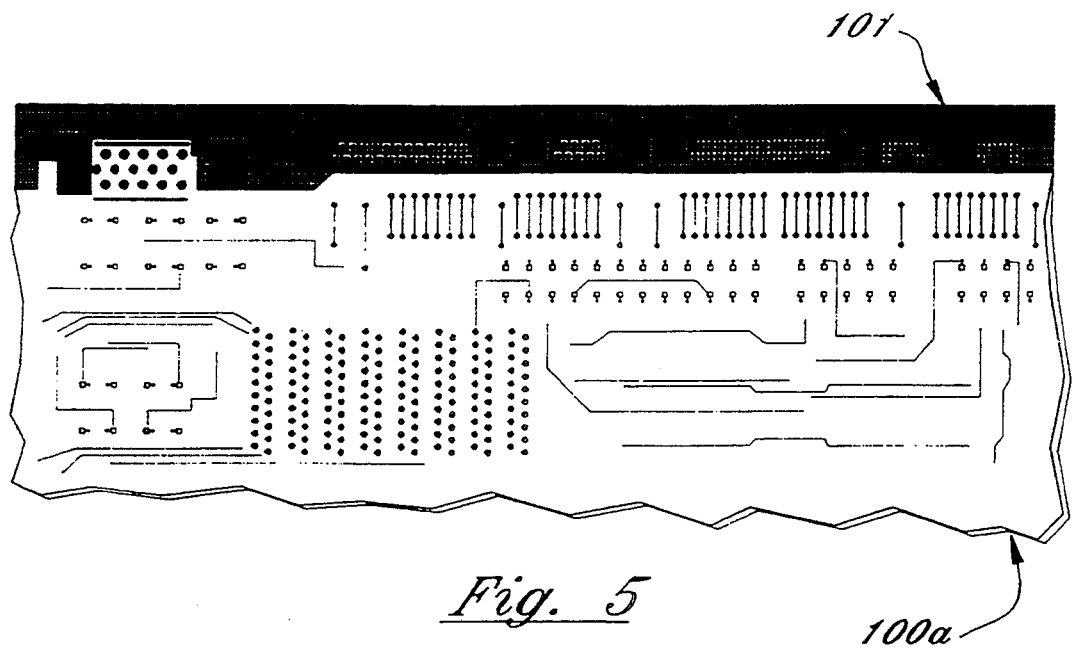
FIG. 5 and FIG. 6 are plan views of exterior layers of the planar board of FIG. 4.
Figure 6:
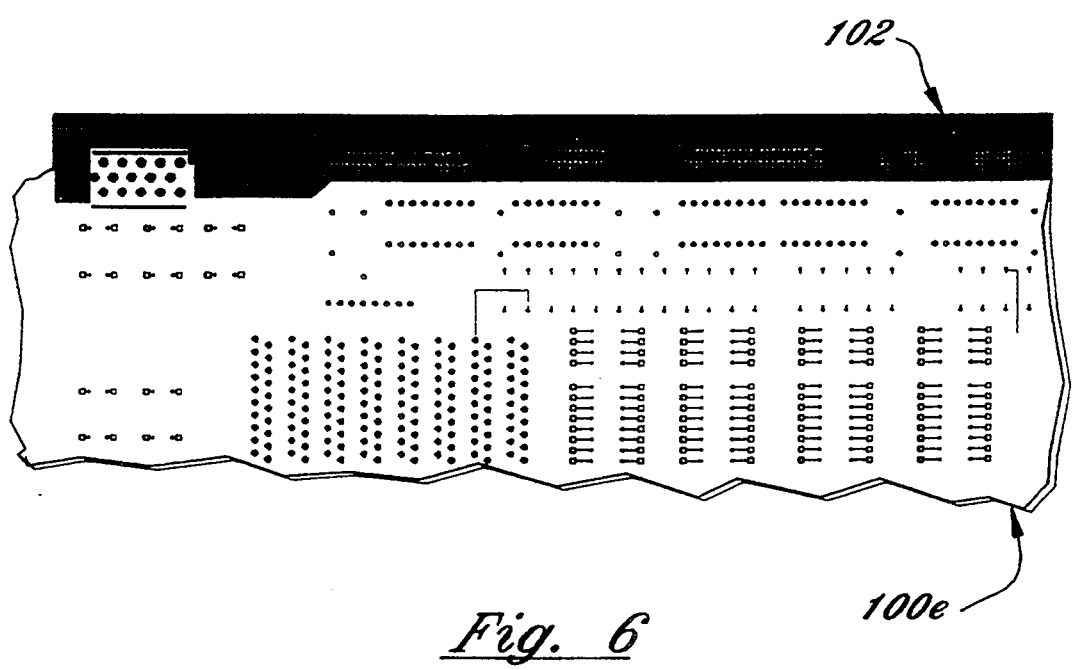

In order to more clearly comprehend the first of the constituent parts of the shielding structure, reference is made to FIG. 4 through 6, where an exploded elevation view of a multilayer printed circuit board and plan views of certain exterior layers of the board are shown. There, the planar board 20 is shown to be a six layer board, formed by three layers faced on both upper and lower sides with conductive pathways and two interposed layers which serve purposes of insulation and separation only. Such a multilayer board is, apart from the inventive characteristics described hereinafter, conventional and well known. The general concepts of designing and assembling such multilayer printed circuit boards are well known to persons of appropriate skill in the applicable arts and described in various technical publications. For those reasons, this description will be directed primarily to the points which distinguish the planar board 20 from others, and not repeat a technical disclosure of generally known principles.

The planar board 20 includes, as stated above, five layers identified as 100A, 100B, 100C, 100D, and 100E. Two such layers, 100B and 100D, serve the purposes of insulation and separation. The surfaces of the others, 100A, 100C and 100D, bear conductive pathways serving to connect operating components of the personal computer 10. One interior surface (such as the lower surface of the uppermost layer 100A, or either surface of the interior layer 100C) bears conductive pathways through which input and output signals pass between components housed within the enclosure of the computer 10 and those external to the enclosure.

In the embodiment shown, input/output signals (or I/O signals) pass through a portion of the planar board 20 which is immediately adjacent the rear panel 25 of the chassis (at a location concealed from view in FIG. 2 by the power supply for the computer 10). Thus the side edge portion of the planar board which displays the characteristics now to be described extends adjacent that panel of the chassis.

The relevant side edge portion of the planar board 20 bears, in layers positioned toward the exterior of the multilayer board from the layer bearing the I/O conductive pathways, ground plane or a ground grid defined by upper and lower grid portions 101 and 102 (FIG. 5 and 6, respectively). Each grid portion, which may be located on the outermost surface of the multilayer planar board 20, has a portion defined by an array of lines of conductive material such as the copper foil or the like used to define conductive pathways throughout the board 20. The lines preferably have a width on the order of six mils, and are spaced one from another at a distance on the order of six to ten mils. The width and spacing of the lines is calculated from suppressing electromagnetic energy at the particular frequencies anticipated as creating difficulty, such as a frequency range of one hundred to three hundred megaHertz. The pattern of the lines includes lines extending at right angles one to another, leaving open areas therebetween.

While it has been proposed heretofore to use solid areas of conductive material such as copper to establish shielding, it has been discovered that one effect of such large areas is distortion of the areas of a printed circuit board having such large uninterrupted areas. While it is perhaps not clear why such distortion occurs, it is believed that it arises due to variations in thermal expansion effects during manufacture, handling and use of the circuit board. The grid of lines here described has been determined to avoid such distortion. As a consequence, the ground grid here described reinforces the side edge of the printed circuit board, maintains the side edge portion in a plane or flat, and strengthens the board against forces otherwise acting to distort it. These functions are in addition to the electromagnetic shielding function described above.

Figure 7:
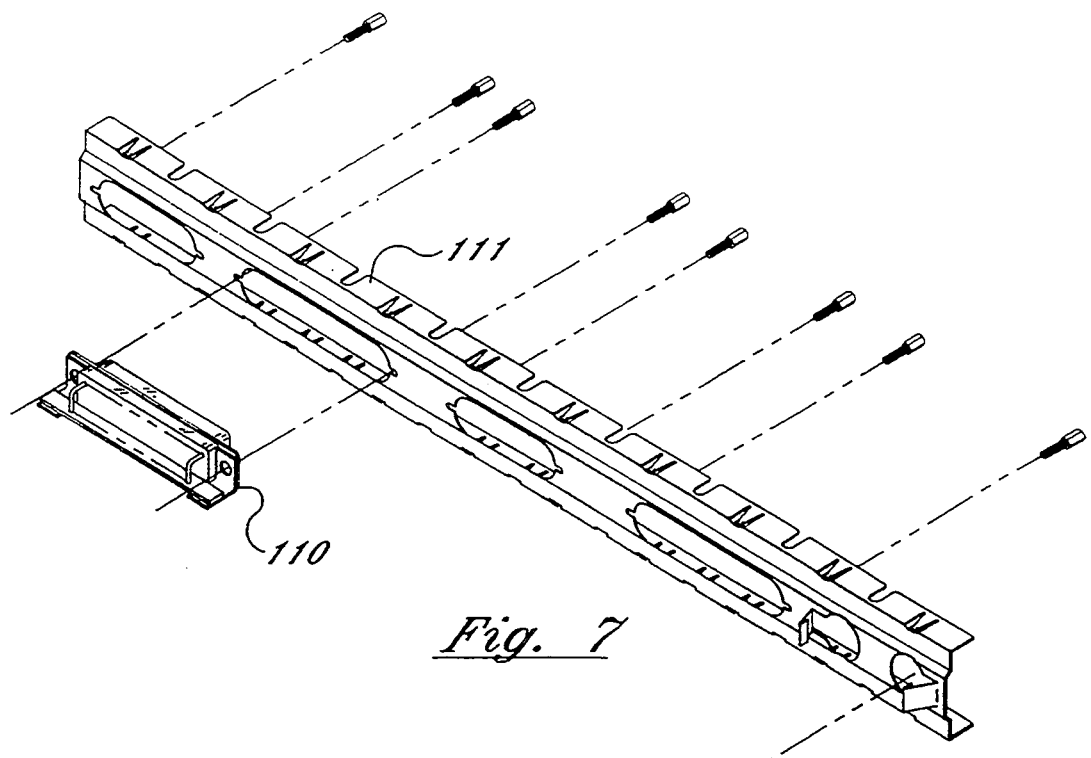
FIG. 7 is an exploded, enlarged perspective view of certain input/output connection and shielding components illustrated in FIG. 2.
Figure 8:
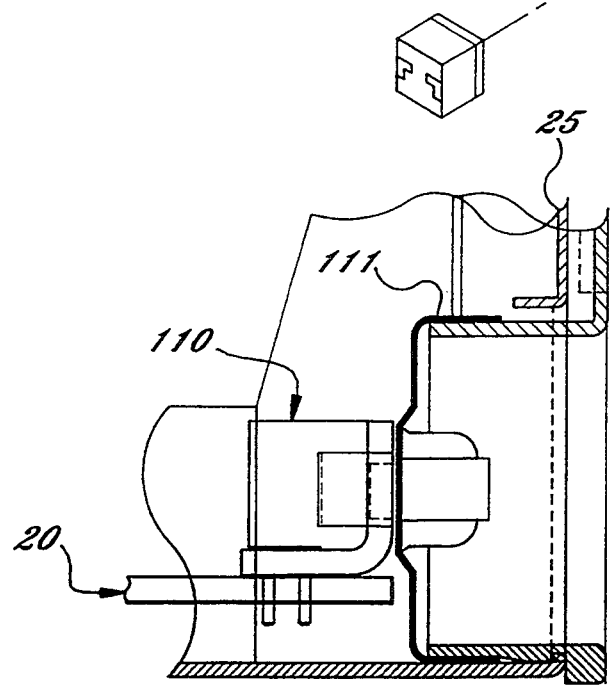
FIG. 8 is a vertical section view through a chassis rear panel portion of the computer of FIG. 2.

Such potentially distorting forces can arise from the connection of connectors, such as the connector 110 illustrated in FIGS. 7 and 8, to the edge portion of the board during manufacture and from the subsequent connection of cables or the like to the connector. Also, the connector 110, which establishes connection between an external device and the conductive pathways in the planar board 20, provides a potential point for either emission of electromagnetic interference or impingement of such interference on the I/O circuits passing through that region of the computer 10.

In accordance with this invention, the second constituent part of the shielding structure is a formed thin metal strip 111 (FIG. 7 and 8) which substantially encloses the connector 110 and others similarly positioned. The strip 111 is given a substantially "U" shaped configuration, with the shape turned on its side and with the base of the U secured to the side edge portion of the planar board 20 in which the ground plane areas 101 and 102 are disposed. The shield strip 111 may be secured by appropriate mechanical fasteners such as threaded studs or the like, or in any other suitable manner. In the form shown, the strip 111 is secured to the conductive shells of the connectors such as the connector 110. The strip 111 and the ground grid portions 101 and 102 are preferably electrically connected together and to a portion of the chassis which functions as a system ground. In the form shown, the strip 111 provides one such connection by engagement with the rear panel 25 of the chassis (FIG. 7). The strip 111 additionally provides structural reinforcement to the planar board 20 edge portion so as to strengthen the board against distortion and the like. This function is in addition to the function of shielding the I/O circuits against the effects of electromagnetic interference at the critical point that such circuits are passing between the interior and exterior of the computer enclosure.

In the drawings and specifications there has been set forth a preferred embodiment of the invention and, although specific terms are used, the description thus given uses terminology in a generic and descriptive sense only and not for purposes of limitation.

What is claimed is:

1. A microcomputer comprising:
   a chassis for mounting a multilayer printed circuit board and having a base and a panel, at least portions of said chassis being connected to a system ground for dissipation of electromagnetic interference,
   a multilayer printed circuit board mounted on said chassis for interconnecting operating components of the microcomputer and having a side edge portion extending adjacent said panel, certain interior layers of said multilayer printed circuit board defining adjacent said side edge portion conductive pathways for input/output signals flowing to and from the operating components of the microcomputer,
   at least one connector mounted on said multilayer printed circuit board for passing input/output signals to and from said conductive pathways, and
   a shielding structure having two elements, each of said elements functioning for (i) shielding against adverse effects otherwise possibly arising from passage of input/output signals to and from said conductive pathways and (ii) structurally reinforcing said side edge portion of said multilayer printed circuit board, said shielding structure being operatively connected to a portion of said chassis connected to a system ground and substantially enclosing a region through which said input/output signals pass between said conductive pathways and said panel.

2. A microcomputer according to claim 1 wherein one of said elements of said shielding structure comprises ground plane areas in layers of said multilayer printed circuit board to the exterior of said conductive pathways for input/output signals, said ground plane areas extending adjacent said side edge portion.

3. A microcomputer according to claim 2 wherein the other of said elements of said shielding structure comprises a formed thin metal strip bridging between said multilayer printed circuit board and said panel.

4. A microcomputer according to claim 1 wherein one of said elements of said shielding structure comprises a formed thin metal strip bridging between said multilayer printed circuit board and said panel.

5. A microcomputer according to claim 4 wherein said formed thin metal strip is mechanically secured and electrically connected to said connector.

6. A microcomputer according to claim 1 wherein one of said elements of said shielding structure comprises ground plane areas in layers of said multilayer printed circuit board to the exterior of said conductive pathways for input/output signals, said ground plane areas being defined by an array of lines of conductive material extending adjacent said side edge portion.

7. A microcomputer according to claim 6 wherein said array of lines comprises a plurality of first lines extending in a first direction and parallel one to another, said first lines being spaced one from another at a distance approximately equal to the width thereof, and a plurality of second lines extending in a second direction and parallel one to another, said second direction being such that said second lines cross said first lines and said lines together define a grid pattern.

8. A microcomputer according to claim 7 wherein said second direction is perpendicular to said first direction.

9. A microcomputer having a high speed system processor compatible with application programs and operating system software designed to execute on slower speed system processors and comprising:
   a chassis for mounting a planar board and having a base, a front panel and a rear panel, and at least portions of said chassis being maintained at a system ground for dissipation of electromagnetic interference,
   a multilayer planar board mounted on said chassis for interconnecting operating components of the microcomputer and having a side edge portion extending adjacent one of said front and rear panels, interior layers of said planar board defining adjacent said side edge portion conductive pathways for input/output signals flowing to and from the operating components of the microcomputer,
   a high speed microprocessor having a real and protected mode of operation electrically connected with said planar board and coupled to a high speed data bus;
   non-volatile memory electrically connected with said planar board and coupled to a slower speed data bus;
   a bus controller electrically connected with said planar board for providing communications between the high speed data bus and the slower speed data bus;
   volatile memory electrically responsive to the high speed data bus;

a memory controller electrically coupled to said volatile memory and said non-volatile memory, said memory controller regulating communications between said volatile memory and said high speed microprocessor;

a cover for engaging said chassis and forming with said chassis a shielded, enclosed volume for containing said microprocessor, memory and controller components of the microcomputer, at least one connector mounted on said planar board for passing input/output signals to and from said conductive pathways, and a shielding structure having two elements, each of said elements functioning for (i) shielding against adverse effects otherwise possibly arising from passage of input/output signals to and from said conductive pathways and (ii) structurally reinforcing said side edge portion of said multilayer printed circuit board, said shielding structure being operatively connected to a portion of said chassis connected to a system ground and substantially enclosing a region through which said input/output signals pass between said conductive pathways and said panel.

* * * * *